US011011672B2

(12) United States Patent
Park et al.

(10) Patent No.: US 11,011,672 B2
(45) Date of Patent: *May 18, 2021

(54) QUANTUM DOTS AND DEVICES INCLUDING THE SAME

(71) Applicant: Samsung Electronics Co., Ltd.

(72) Inventors: Garam Park, Seoul (KR); Tae Hyung Kim, Seoul (KR); Eun Joo Jang, Suwon-si (KR); Hyo Sook Jang, Suwon-si (KR); Shin Ae Jun, Seongnam-si (KR); Yongwook Kim, Suwon-si (KR); Taekhoon Kim, Hwaseong-si (KR); Jihyun Min, Seoul (KR); Yuho Won, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/786,004

(22) Filed: Feb. 10, 2020

(65) Prior Publication Data

US 2020/0220043 A1    Jul. 9, 2020

Related U.S. Application Data

(63) Continuation of application No. 16/111,848, filed on Aug. 24, 2018, now Pat. No. 10,559,712, which is a (Continued)

(30) Foreign Application Priority Data

Dec. 22, 2015 (KR) .................. 10-2015-0184033

(51) Int. Cl.
*H01L 33/04* (2010.01)
*C09K 11/02* (2006.01)
(Continued)

(52) U.S. Cl.
CPC ............ *H01L 33/04* (2013.01); *C09K 11/025* (2013.01); *C09K 11/615* (2013.01); *C09K 11/70* (2013.01);
(Continued)

(58) Field of Classification Search
CPC ......... H01L 33/04; H01L 33/24; H01L 33/28; H01L 33/30; H01L 33/32; H01L 33/34;
(Continued)

(56) References Cited

U.S. PATENT DOCUMENTS 6,322,901 B1    11/2001    Bawendi et al.
6,861,155 B2    3/2005    Bawendi et al.
(Continued)

FOREIGN PATENT DOCUMENTS

CN    104512860 A    4/2015
CN    104974759 A    10/2015
(Continued)

OTHER PUBLICATIONS

The Grounds of Opposition dated May 15, 2019, of the corresponding application, EP Patent Application No. 16196124.8.
(Continued)

*Primary Examiner* — Igwe U Anya
(74) *Attorney, Agent, or Firm* — Cantor Colburn LLP

(57) ABSTRACT

A quantum dot includes a core-shell structure including a core including a first semiconductor nanocrystal and a shell disposed on the core, and including a material at least two different halogens, and the quantum dot does not include cadmium.

21 Claims, 3 Drawing Sheets

$X_1$: First halogen
$X_2$: Second halogen

Related U.S. Application Data continuation of application No. 15/386,512, filed on Dec. 21, 2016, now Pat. No. 10,074,770.

(51) Int. Cl.

| C09K 11/61 | (2006.01) |
| --- | --- |
| C09K 11/70 | (2006.01) |
| C09K 11/88 | (2006.01) |
| H01L 33/24 | (2010.01) |
| H01L 33/28 | (2010.01) |
| H01L 33/30 | (2010.01) |
| H01L 33/32 | (2010.01) |
| H01L 33/34 | (2010.01) |

(52) U.S. Cl.
CPC ............ C09K 11/883 (2013.01); H01L 33/24 (2013.01); H01L 33/28 (2013.01); H01L 33/30 (2013.01); H01L 33/32 (2013.01); H01L 33/34 (2013.01)

(58) Field of Classification Search
CPC ..... C09K 11/025; C09K 11/615; C09K 11/70; C09K 11/883
USPC .......................................................... 257/13
See application file for complete search history.

(56) References Cited

U.S. PATENT DOCUMENTS

| 7,105,051 | B2 | 9/2006 | Peng et al. | |
| --- | --- | --- | --- | --- |
| 7,427,523 | B2 | 9/2008 | Boardman et al. | |
| 7,963,119 | B2 | 6/2011 | Campbell et al. | |
| 8,035,772 | B2 | 10/2011 | Kim et al. | |
| 8,252,205 | B2 | 8/2012 | Jun et al. | |
| 8,436,964 | B2 | 5/2013 | Kim et al. | |
| 8,545,736 | B2 | 10/2013 | Jun et al. | |
| 8,784,685 | B2 | 7/2014 | Lifshitz et al. | |
| 8,963,119 | B2 | 2/2015 | Jang et al. | |
| 9,082,982 | B2 | 7/2015 | Jun et al. | |
| 9,517,936 | B2 | 12/2016 | Jeong et al. | |
| 9,834,724 | B2 | 12/2017 | Kim et al. | |
| 10,074,770 | B2 | 9/2018 | Park ...................... | H01L 33/04 |
| 2004/0126072 | A1 | 7/2004 | Hoon Lee .............. | B82Y 10/00 |
| | | | | 385/122 |
| 2008/0014463 | A1 | 1/2008 | Varadarajan et al. | |
| 2008/0138514 | A1 | 6/2008 | Jang et al. | |
| 2010/0006775 | A1 | 1/2010 | Gibson | |
| 2010/0110728 | A1 | 5/2010 | Dubrow et al. | |
| 2010/0283072 | A1 | 11/2010 | Kazlas et al. | |
| 2011/0220844 | A1* | 9/2011 | Tulsky ................ | C09B 68/4257 |
| | | | | 252/301.36 |
| 2012/0113671 | A1 | 5/2012 | Sadasivan et al. | |
| 2012/0113672 | A1 | 5/2012 | Dubrow et al. | |
| 2012/0305918 | A1 | 12/2012 | Shum | |
| 2013/0129632 | A1 | 5/2013 | Leong et al. | |
| 2014/0001405 | A1* | 1/2014 | Guo ...................... | C09K 11/025 |
| | | | | 252/301.33 |
| 2014/0027711 | A1 | 1/2014 | Breen et al. | |
| 2014/0071381 | A1 | 3/2014 | Jang et al. | |
| 2014/0326921 | A1 | 11/2014 | Lu et al. | |
| 2015/0021548 | A1 | 1/2015 | Liu ........................ | C09K 11/02 |
| | | | | 257/13 |
| 2015/0083969 | A1 | 3/2015 | Kim ...................... | C09K 11/025 |
| | | | | 252/301.6 S |
| 2015/0194577 | A1 | 7/2015 | Glarvey et al. | |
| 2015/0203747 | A1 | 7/2015 | Haley ................... | H01L 33/502 |
| | | | | 257/98 |
| 2015/0218442 | A1 | 8/2015 | Jun ...................... | C09K 11/025 |
| | | | | 252/519.2 |
| 2015/0291422 | A1 | 10/2015 | Jeong et al. | |
| 2018/0094190 | A1 | 4/2018 | Kim et al. | |
| 2018/0148638 | A1* | 5/2018 | Ahn ..................... | H01L 51/0037 |
| 2019/0112527 | A1* | 4/2019 | Moriyama ........... | C09K 11/025 |
| 2019/0169500 | A1* | 6/2019 | Kim ..................... | H01L 51/502 |

FOREIGN PATENT DOCUMENTS

| EP | 2853578 | A1 | 4/2015 |
| --- | --- | --- | --- |
| EP | 2905321 | A1 | 8/2015 |
| KR | 100871961 | B1 | 11/2008 |
| KR | 101165100 | B1 | 7/2012 |
| KR | 1020130044071 | A | 5/2013 |
| KR | 1020140032811 | A | 3/2014 |
| KR | 101460155 | B1 | 11/2014 |
| KR | 1020150032655 | A | 3/2015 |
| KR | 1015255240000 | B1 | 5/2015 |
| KR | 1015255250000 | B1 | 5/2015 |
| WO | 2013171517 | A1 | 11/2013 |
| WO | 2015127494 | A1 | 9/2015 |

OTHER PUBLICATIONS

European Search Report for European Patent Application No. 18179312.6 dated Jun. 27, 2019.
Fan Zuo.,"Binary-Metal Perovskites Toward High-Performance Planar-Heterojunction Hybrid Solar Cells," Advanced Materials, Aug. 14, 2014, pp. 6454-6460, vol. 26, Issue 37.
Jun Pan et al., "Air-Stable Surface-Passivated Perovskite Quantum Dots for Ultra-Robust, Single- and Two-Photon-Induced Amplified Spontaneous Emission," J. Phys. Chem. Lett. 2015, Dec. 1, 2015, pp. 5027-5033, vol. 6, Issue 24.
Kovaienko 2019 (Declaration of M. Kovaienko).
SigmaAldrich, Cesium carbonate ReagentPlus®, 99%, 2019.
Maryna I. Bodnarchuk et al., "Rationalizing and Controlling the Surface Structure and Electronic Passivation of Cesium Lead Halide Nanocrystals," ACS Energy Lett. 2019, Nov. 27, 2018, pp. 63-74, vol. 4, Issue No. 1.
NFOA, dated Sep. 20, 2017, (U.S. Appl. No. 15/386,512).
Non-Final Office Action dated Jul. 18, 2019 for (U.S. Appl. No. 15/335,700).
Third Party Submission dated Nov. 8, 2017 in (U.S. Appl. No. 15/335,700).
Notice of Allowance, dated May 10, 2018, (U.S. Appl. No. 15/386,512).
Observations by a third party & J. Am. Chem. Soc. 2015, 137, 10276-10281 dated Jun. 27, 2019 for European Patent Application No. 18179312.6.
Sergil Yakunin et al., "Low-threshold amplified spontaneous emission and lasing from colloidal nanocrystals of caesium lead halide perovskites," Nature Communications, Aug. 20, 2015, pp. 1-9.
Akkerman et al., "Tuning the Optical Properties of Cesium Lead Halide Perovskite Nanocrystals by Anion Exhange Reactions", pp. 6, PUblication date Jul. 27, 2015, ACS PUblications, Journal of the American Chemical Society, vol. 137, pp. 10276-10281.
Alexander H. IP et al., Hybrid passivated colloidal quantum dot solids, 2012, pp. 577-582, vol. 7, Nature nanotechnology.
European Search Report for European Patent Application No. 16196124.8 dated Apr. 18, 2017.
European Search Report for European Patent Application No. 16205175.9 dated Mar. 28, 2017.
Protesescu et al., "Nanocrystals of Cesium Lead halide Perovskites (CsPbX3, X=Cl, Br, and I): Novel Optoelectronic Materials Showing Bright Emission with Wide Color Gamut", Nano Letters, 2015, pp. 1-5.
Yiming Zhao et al., High-Temperature Luminescence Quenching of Colloidal Quantum Dots, Article, 2012, pp. 9058-9067, vol. 6, No. 10, ACSNano.
Zhang et al., "Brightly Luminescent and Color-Tunable Coloidal CH3NH3PbX3 (X=Br, I, Cl) Quantum Dots: Potential Alternatives for Display Technology", ACSNano, vol. 9, No. 4, 2015, pp. 4533-4542.
Zhang et al., "Solution-Phase Synthesis of Cesium Lead Halide Perovskite Nanowires", JACS, 137. 2015, pp. 9230-9233.
Akkerman et al., "Tuning the Optical Properties of Cesium Lead Halide Perovskite Nanocrystals by Anion Exchange Reactions", pp. 6, Publication date Jul. 27, 2015, ACS Publications, Journal of the American Chemical Society, vol. 137, pp. 10276-10281.
Alexander H. Ip et al., Hybrid passivated colloidal quantum dot solids, 2012, Nature Nanotechnology, pp. 577-582, vol. 7.

(56) References Cited

OTHER PUBLICATIONS

Yiming Zhao et al., High-Temperature Luminescence Quenching of Colloidal Quantum Dots, ACS Nano, 2012, pp. 9058-9067, vol. 6, No. 10.
Sergii Yakunin et al., "Low-threshold amplified spontaneous emission and lasing from colloidal nanocrystals of caesium lead halide perovskites," Nature Communications, Aug. 20, 2015, pp. 1-9.
Chinese Office Action for Chinese Patent Application No. 201611195503.4 dated Nov. 25, 2020.
Woo et al., "Ultrastable PbSe Nanocrystal Quantum Dots via in Situ Formation of Atomically Thin Halide Adlayers on PbSe(100)", Journal of The American chemical Society, 136, 2014, 8883-8886.

\* cited by examiner

QUANTUM DOTS AND DEVICES INCLUDING THE SAME

CROSS-REFERENCE TO RELATED APPLICATION

This application is a continuation application of U.S. patent application Ser. No. 16/111,848, filed Aug. 24, 2018, and issued as U.S. Pat. No. 10,559,712, which is a continuation application of U.S. patent application Ser. No. 15/386,512, filed Dec. 21, 2016, and issued as U.S. Pat. No. 10,074,770, which claims priority to and the benefit of Korean Patent Application No. 10-2015-0184033 filed in the Korean Intellectual Property Office on Dec. 22, 2015, and all the benefits accruing therefrom under 35 U.S.C. § 119, the entire content of which is incorporated herein in its entirety by reference.

BACKGROUND

1. Field

Quantum dots and devices including the same are disclosed.

2. Description of the Related Art

Nanoparticles have physical characteristics (e.g., energy bandgaps and melting points) that depend on particle size, unlike bulk materials. For example, a semiconductor nanocrystal, also known as a quantum dot (QD) is a semiconductor material having a crystalline structure with a size of several nanometers. Quantum dots have such a small size that they have a large surface area per unit volume and exhibit quantum confinement effects, and thus have different physicochemical characteristics from the characteristics of the bulk material. Quantum dots may absorb light from an excitation source and may emit light energy corresponding to an energy bandgap of the quantum dot. In the quantum dots, the energy bandgap may be selected by controlling the sizes and/or the compositions of the nanocrystals. Also, QDs have desirable photoluminescence properties and have a high color purity. Therefore, QD technology is used for various applications, including a display device, an energy device, a bio-light emitting element, or the like.

A quantum dot having a core-shell structure may have a slightly increased luminous efficiency due to surface passivation by the shell, however most of these systems include cadmium. Cadmium poses serious environmental problems, and thus it is desirable to provide a cadmium-free semiconductor nanocrystal particle with desirable light emitting properties.

Electronic devices including quantum dots may be operated in a high temperature environment; and thereby luminous efficiency of the quantum dots may be adversely affected by the ambient temperature. Therefore, there is a need to develop quantum dots in which the negative impact of temperature is reduced.

SUMMARY

An embodiment provides environmentally-friendly quantum dots having improved photoluminescence properties and temperature characteristics.

Another embodiment provides a method of producing the quantum dots.

Yet another embodiment provides a polymer composite including the quantum dots.

Still another embodiment provides an electronic device including the quantum dots.

In an embodiment, a quantum dot includes a core-shell structure including a core including a first semiconductor nanocrystal; and a shell disposed on the core, the shell including a crystalline or amorphous material and at least two different halogens, wherein the quantum dot does not include cadmium.

In case of the quantum dot, a solid state photoluminescence quantum efficiency of the quantum dot when measured at 90° C. or greater is greater than or equal to about 95% of a solid state photoluminescence quantum efficiency of the quantum dot when measured at 25° C.

The at least two halogens may include fluorine; and at least one of the other halogens include chlorine, bromine, iodine, or a combination thereof.

The quantum dot may have a solid state photoluminescence quantum efficiency, when measured at a temperature of 100° C., that is greater than or equal to about 95% of the solid state photoluminescence quantum efficiency thereof when measured at a temperature of 25° C.

The quantum dot may have a solid state photoluminescence quantum efficiency, when measured at a temperature of 150° C., that is greater than or equal to about 80% of the solid state photoluminescence quantum efficiency thereof measured at a temperature of 25° C.

The halogen may present in or on the shell as a metal halide or can be doped therein.

The shell may have a thickness of at least one monolayer of the crystalline or amorphous material, and at least one of the halogens may be present at or outside (i.e., after) the thickness of the one monolayer.

A total amount of the halogens may be greater than or equal to about 30 atomic percent, with respect to a total amount of a metal included in the core.

The first semiconductor nanocrystal may include a first metal including a Group II metal excluding cadmium, a Group III metal, a Group IV metal, or a combination thereof.

The material of the shell may include at least one second metal that is different from the first metal and includes a Group I metal, a Group II metal excluding cadmium, a Group III metal, a Group IV metal, or a combination thereof.

The first semiconductor nanocrystal may include a Group II-VI compound excluding a cadmium-containing compound, a Group III-V compound, a Group IV-VI compound, a Group IV element or compound, a Group I-III-VI compound, a Group I-II-IV-VI compound, or a combination thereof.

The crystalline or amorphous material of the shell may include a Group II-VI compound excluding a cadmium-containing compound, a Group III-V compound, a Group IV-VI compound, a Group IV element or compound, a Group I-III-VI compound, a Group I-II-IV-VI compound, a metal-containing halogen compound (e.g., a metal halide), a metal oxide, or a combination thereof.

The Group II-VI compound may include ZnS, ZnSe, ZnTe, ZnO, HgS, HgSe, HgTe, MgSe, MgS, ZnSeS, ZnSeTe, ZnSTe, HgSeS, HgSeTe, HgSTe, HgZnS, HgZnSe, HgZnTe, MgZnSe, MgZnS, HgZnTeS, HgZnSeS, HgZnSeTe, HgZnSTe, or a combination thereof, the Group III-V compound may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaIn- NAs, GaInNSb, GaInPAs, GaInPSb, InAlNP, InAlNAs, InAlNSb, InAlPAs, InAlPSb, or a combination thereof, the Group IV-VI compound may include SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, or a combination thereof, the Group I-III-VI compound may include $CuInSe_2$, $CuInS_2$, CuInGaSe, CuInGaS, or a combination thereof, the Group II-III-VI compound may include ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, or a combination thereof, the Group I-II-IV-VI compound may include CuZnSnSe, CuZnSnS, or a combination thereof, the Group IV element or compound may include Si, Ge, SiC, SiGe, or a combination thereof, the metal-containing halogen compound may be LiF, NaF, KF, $BeF_2$, $MgF_2$, $CaF_2$, $SrF_2$, CuF, AgF, AuF, $ZnF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, AuCl, $ZnCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $HgI_2$, $AlI_3$, $GaI_3$, $InI_3$, $SnI_2$, $PbI_2$, or a combination thereof, and the metal oxide may include $In_2O_3$, PbO, HgO, MgO, $Ga_2O_3$, $Al_2O_3$, ZnO, $SiO_2$, zinc oxysulfide, zinc oxyselenide, zinc oxysulfide selenide, indiumphosphide oxide, indiumphosphide oxysulfide, or a combination thereof.

The first semiconductor nanocrystal may include a Group III-V compound and the shell may include a Group II-VI compound.

The quantum dot may have a quantum yield of greater than or equal to about 85%.

Another embodiment provides a method of producing a quantum dot, the method including:

obtaining a first mixture including a first precursor, a ligand compound, and a solvent;

adding a second precursor, a first halogen source, and a first semiconductor nanocrystal to the first mixture to obtain a second mixture;

heating the second mixture to a reaction temperature effective to perform a reaction between the first precursor and the second precursor; and adding a second halogen source to the second mixture after initiating the reaction between the first precursor and the second precursor, wherein a core-shell structure of the quantum dot includes a core including a first semiconductor nanocrystal, and a shell including a crystalline or amorphous material disposed on the core, wherein the quantum dot does not include cadmium, and wherein the shell includes at least two halogens.

In an embodiment, the at least two halogens includes fluorine; and at least one of the other halogens is chlorine, bromine, iodine, or a combination thereof.

The quantum dot may have a solid state photoluminescence quantum efficiency at a temperature of about 90° C. or higher that is greater than or equal to about 95% of the solid state photoluminescence quantum efficiency thereof as measured at 25° C.

The first precursor may include at least one second metal that is selected from a Group II metal excluding cadmium, a Group III metal, a Group IV metal, or a combination thereof, and the first precursor may be in a form of a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, or a metal peroxide.

The second precursor may include a Group V element, a Group IV element, or a compound including the Group V element, or the Group IV element.

The ligand compound may include a compound of the formula RCOOH, $RNH_2$, $R_2NH$, $R_3N$, RSH, $R_3PO$, $R_3P$, ROH, RCOOR', $RPO(OH)_2$, $R_2POOH$ (wherein, each R and R' are independently a substituted or unsubstituted C1 to C24 aliphatic hydrocarbon group or a substituted or unsubstituted C6 to C20 aromatic hydrocarbon group), or a combination thereof.

The first halogen source may include fluorine.

The second halogen source may include chlorine, bromine, iodine, or a combination thereof.

The first halogen source may include HF, $NH_4F$, LiF, NaF, KF, $BeF_2$, $MgF_2$, $CaF_2$, $SrF_2$, CuF, AgF, AuF, $ZnF_2$, $HgF_2$, $AlF_3$, $GaF_3$, $InF_3$, $SnF_2$, $PbF_2$, $HBF_4$, a fluorine-containing ionic liquid, or combination thereof.

The second halogen source may include HCl, $NH_4Cl$, HBr, $NH_4Br$, LiCl, NaCl, KCl, $BeCl_2$, $MgCl_2$, $CaCl_2$, $SrCl_2$, CuCl, AgCl, AuCl, $ZnCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $HgI_2$, $AlI_3$, $GaI_3$, $InI_3$, $SnI_2$, $PbI_2$, an aliphatic hydrocarbon chloride, an aliphatic hydrocarbon bromide, an aliphatic hydrocarbon iodide, or a combination thereof.

The method may further include adding the second precursor after the initiation of a reaction between the first precursor and the second precursor.

In the method, the second halogen source may be used in a greater amount than the first halogen source.

In another embodiment, a quantum dot polymer composite includes a polymer matrix; and the aforementioned quantum dot dispersed in the polymer matrix.

The polymer matrix may include a thiolene polymer, a (meth)acrylate polymer, a urethane polymer, an epoxy polymer, a vinyl polymer, a silicone polymer, or a combination thereof.

Another embodiment provides an electronic device including the aforementioned quantum dot.

According to an embodiment, environmentally friendly quantum dots that may mitigate the thermal quenching phenomenon and have improved solid state quantum efficiency may be provided.

The quantum dots of the embodiments may find their use in many fields such as various display devices, biological labeling (e.g., a biosensor, a bio-imaging, and the like), a photo-detector, a hybrid composite, and the like.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
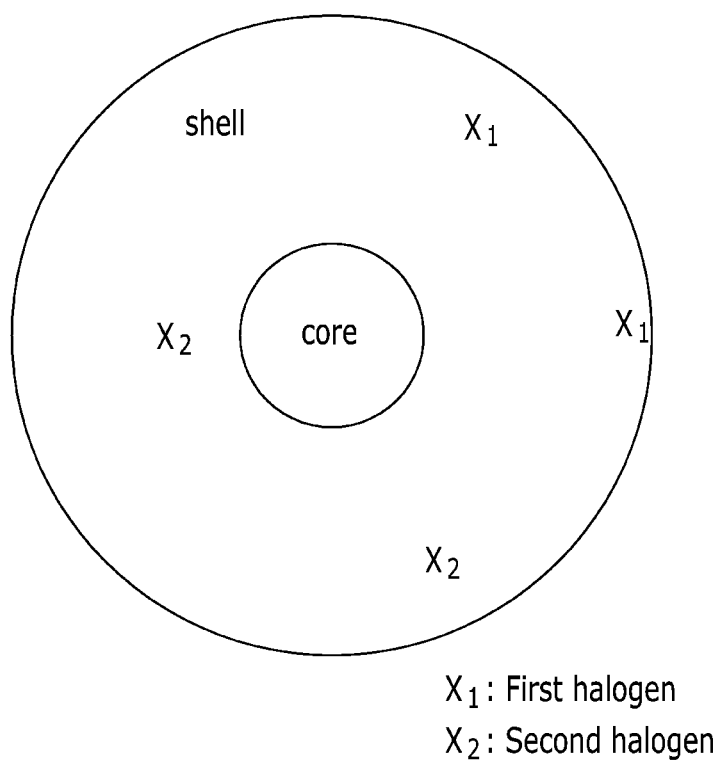
FIG. 1 is a schematic illustration of a cross-section of an embodiment of a quantum dot.

Advantages and characteristics of this disclosure, and a method for achieving the same, will become evident referring to the following exemplary embodiments together with the drawings attached hereto. The embodiments, may, however, be embodied in many different forms and should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, the term "substituted" refers to a group or compound wherein at least one of the hydrogen atoms thereof is substituted with a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C3 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, the term "hydrocarbon group" refers to a monovalent group containing carbon and hydrogen (e.g., alkyl group, alkenyl group, alkynyl group, or aryl group) formed by a removal of a hydrogen atom from an aliphatic or aromatic hydrocarbon such as alkane, alkene, alkyne, or arene. In the hydrocarbon group, at least one methylene (—CH$_2$—) moiety may be replaced with an oxide (—O—) moiety.

As used herein, the term "metal" includes a metal and a semi-metal.

As used herein, the term "alkyl" refers to a linear or branched, saturated monovalent hydrocarbon group (e.g., methyl, hexyl, etc.).

As used herein, the term "alkenyl" refers to a linear or branched monovalent hydrocarbon group having at least one carbon-carbon double bond.

As used herein, the term "aryl" refers to a monovalent group formed by removing one hydrogen atom from at least one aromatic ring (e.g., phenyl or naphthyl).

As used herein, when a definition is not otherwise provided, the term "hetero" refers to inclusion of 1 to 3 heteroatoms that can be N, O, S, Si, P, or a combination thereof.

As used herein, the term "alkylene group" refers to a straight or branched saturated aliphatic hydrocarbon group having a valence of at least two, optionally substituted with one or more substituents. The term "arylene group" refers to a functional group having a valence of at least two obtained by removal of at least two two hydrogens in an aromatic ring, optionally substituted with one or more substituents.

Further as used herein, when a definition is not otherwise provided, an alkyl group is a C1 to C20 alkyl, or a C1 to C12 alkyl, or a C1 to C6 alkyl.

As used herein, the term "Group" refers to a Group of Periodic Table.

As used herein, "Group I" refers to Group IA and Group IB, and examples of Group I include Li, Na, K, Ru, and Cs, but are not limited thereto.

As used herein, "Group II" refers to Group IIA and Group IIB, and examples of Group II include Cd, Zn, Hg, and Mg, but are not limited thereto, except where Cd is specifically excluded.

As used herein, "Group III" refers to Group IIIA and Group IIIB, and examples of Group III include Al, In, Ga, and Tl, but are not limited thereto.

As used herein, "Group IV" refers to Group IVA and Group IVB, and examples of a Group IV include Si, Ge, and Sn, but are not limited thereto.

As used herein, the term "metal" may include a semimetal such as Si.

As used herein, the term "doping" refers to the inclusion of a dopant in a crystal structure. In an exemplary embodiment, inclusion of a dopant in the crystal structure does not substantially change the crystal structure. For example, a dopant atom (e.g., a halogen) may be a substituted for an atom in a crystal structure, or present in the interstices of a crystal lattice. In some embodiments, the X-ray diffraction spectrum of a doped compound is substantially the same as the X-ray diffraction spectrum of an undoped compound. In an embodiment, the presence of the dopant in the crystal structure may be confirmed, for example, by X-ray photoelectron spectroscopy, energy dispersive X ray spectroscopy, or inductively coupled plasma-atomic emission spectroscopy (ICP-AES).

As used herein, the term quantum yield" (QY) is a value determined from a photoluminescence spectrum obtained by dispersing quantum dots in toluene, and is calculated with respect to the photoluminescent peak of an ethanol solution of coumarin dye (absorption (optical density) at 458 nanometers (nm) is 0.1).

As used herein, "solid state photoluminescence quantum efficiency (QE)" is a value obtained from a photoluminescence intensity of quantum dots dispersed in a solid matrix. A ratio of the solid state photoluminescence QE at a predetermined temperature to the solid state photoluminescence QE at a reference temperature (e.g., 25° C.) may reflect the properties of the quantum dot regarding "thermal quenching phenomenon." For example, a photoluminescence intensity of a quantum dot-solid matrix film including a polymer matrix and a plurality of quantum dots dispersed therein is first measured at room temperature (e.g., 25° C.), and a photoluminescence intensity of the quantum dot-solid matrix film is subsequently measured at increasing temperatures. The ratio of photoluminescence intensity at each temperature with respect to the photoluminescence intensity at 25° C. is the relative photoluminescence intensity (%), which may serve as an indicator of the quantum dot's property as to the thermal quenching.

A quantum dot according to an embodiment has a core-shell structure that includes a core including a first semiconductor nanocrystal and a shell including a crystalline or amorphous material disposed on the core surface (e.g., on at least a portion of a surface or on the entire surface of the core). The shell may include a multi-layered shell including at least two layers. When the shell is a multi-layered shell, each layer (e.g., each of the adjacent layers) may have the same or a different composition. Without wishing to be bound by any theory, in the aforementioned quantum dot, the shell may effectively passivate a surface of the core (e.g., the traps thereon) to increase the luminous efficiency and to enhance the stability of the quantum dot. In addition, the shell may serve as a physical barrier that improves the stability of a core that may be otherwise susceptible to degradation by exposure to the ambient environment. The material of the shell may be crystalline or amorphous.

The quantum dot does not include cadmium, and the shell of the quantum dot includes at least one halogen (for example, fluorine, chlorine, bromine, iodine, or a combination thereof). In an embodiment, the shell of the quantum dot may include at least two halogens, and the halogens may include a fluorine (as a first halogen); and chlorine, bromine, iodine, or a combination thereof. The halogen may be doped or in a form of a metal halide in the shell.

The solid state photoluminescence quantum efficiency of the quantum dot, when measured at a temperature of 90° C. or greater, may be greater than or equal to about 95% of the solid state photoluminescence quantum efficiency of the quantum dot when measured at a temperature of 25° C.

The "solid state photoluminescence quantum efficiency" is related to a photoluminescence intensity measured for the quantum dots dispersed in a solid matrix (instead of a solution). The photoluminescence intensity may be measured by a spectrometer at a predetermined wavelength of excitation light.

Nanocrystal particles including a semiconductor material (i.e., quantum dots) may have an energy bandgap that varies based on size and composition, and may have desirable photoluminescence properties. Thus, these compounds may be suitable as a material applicable for various fields such as a display, an energy device, a semiconductor, and a bio device.

Quantum dots have been included in various electronic devices, and the operating temperature of the devices may increase up to a temperature far higher than room temperature. Accordingly, the quantum dots may be subjected to a high temperature environment when they are used in the actual devices. For example, the quantum dots may be exposed to a temperature that is greater than about 70° C., greater than or equal to about 90° C., greater than or equal to about 100° C., greater than or equal to about 110° C., greater than or equal to about 120° C., greater than or equal to about 130° C., or greater than or equal to about 150° C. For example, in the case of a high power LED, the quantum dots tend to be exposed to a relatively high temperature due to the thermal emission generated from the p-n junction and the light conversion layer and the heat generated from the quantum dots themselves, which may be unfavorable for the application of quantum dots. While not wanting to be bound by theory, it is understood that this is because the photoluminescence properties of the quantum dots may be affected by the temperature. For example, thermal quenching may decrease the luminous efficiency of quantum dots at a high temperature.

Many hypotheses have been suggested regarding the cause of the thermal quenching phenomenon of the quantum dots. The quantum dots (QD) have a high ratio of a surface area with respect to a volume, and thus may have a great number of the surface related trap states. The trap states may become a path that moves the excited charge carriers into the photoluminescence quenching center. In other words, the trap states on the QD surface may trap the charge carriers, causing a decrease in the photoluminescence (PL). As the temperature increases, the number of the trap states may be temporarily increased (for example, due to the generation of the thermally-activated trap states), and the thermally activated carrier may be easily excited at such a trap state, activating the trapping and thereby causing a decrease in the PL intensity. In addition, rather than dropping to the ground state with light emission, the carriers trapped in the trap state are escaping and thermally scattering (for example, via the non-radiative process), and this may lead to the decrease of their PL intensity.

Also, most of the quantum dots capable of exhibiting good performance in terms of the photoluminescence properties and stability include cadmium (Cd). For example, the quantum dots including Cd in the core and/or the shell may show a relatively high luminous efficiency, and the thermal quenching phenomenon is not significant for these quantum dots. However, as cadmium is one of the atoms posing serious environmental problems, the cadmium-free quantum dots have advantages in terms of the environment. A Group III-V compound semiconductor nanocrystal is a cadmium free quantum dot, but it is not easy to control its synthesis reaction because the precursors used therein are very susceptible to oxidation and their activity is poor in comparison with the cadmium-based semiconductor nanocrystal (e.g., the CdSe-based quantum dot). As a type of the Group III-V semiconductor nanocrystal, the quantum dot including a Group III-V core such as InP have been researched intensively. Despite this fact, however, synthesis of the InP-based semiconductor is difficult and it may have photoluminescence properties and thermal stability that are inferior to those of the Cd-based quantum dots.

The quantum dots according to an embodiment may achieve an improvement in thermal quenching phenomenon together with the increased luminous efficiency, even when they do not include cadmium.

The shell has a thickness of greater than or equal to 1 monolayer of crystalline or amorphous material (e.g., a thickness of 2 monolayers, 3 monolayers, 4 monolayers, or higher), and the halogen or the second halogen may be present on or after the first monolayer or on or after the total number of monolayers. For example, the shell may have a thickness of greater than or equal to about 0.3 nanometers (nm), for example, a thickness of greater than or equal to about 0.6 nm, and the second halogen may be present outside a shell thickness of, for example, greater than or equal to 0.3 nm. In an embodiments, the shell has a thickness of greater than or equal to 1 monolayer of the crystalline or the amorphous material (e.g., 0.3 nm or more), and may include chlorine, bromine, iodine, or a combination thereof after the first monolayer. In the shell, the fluorine may be present at the interface between the core and the shell or inside of the shell, but it is not limited thereto.

A total amount of the halogen may be greater than or equal to about 30 atomic percent (at. %), for example greater than or equal to about 40 at. %, greater than or equal to about 50 at. %, greater than or equal to about 60 at. %, or greater than or equal to about 65 at. %, e.g., about 30 at. % to about 90 at. %, about 30 at. % to about 80 at. %, or about 30 at. % to about 70 at. %, with respect to a total amount of the metal included in the core. In an embodiment, the amount of fluorine included in the quantum dots may be within a range of greater than 0 mole percent (mol %), (e.g., greater than or equal to about 0.1 mol %) to less than or equal to about 20 mol % based on the total amounts of all atoms included in the quantum dot. According to an embodiment, the amount of the second halogen (i.e., chlorine, bromine, iodine, or a combination thereof) included in the quantum dot may be within a range of greater than about 0 mol % (e.g., greater than or equal to about 0.1 mol %) and less than or equal to about 20 mol % based on a total amount of all the atoms included in the quantum dot.

Without wishing to be bound by any theory, it is estimated that the shell including the halogen (e.g., the first and second halogens) may effectively passivate the core and may reduce the number of trap states that may cause the thermal quenching phenomenon in the quantum dots according to an embodiment.

Accordingly, the quantum dots of the embodiments may achieve the improvement relating to the thermal quenching phenomenon and have the improved luminous efficiency when they have a relatively thin shell.

Accordingly, the quantum dots according to an embodiment may show a solid state quantum efficiency measured at a temperature of 100° C. that is greater than or equal to about 95%, for example, greater than or equal to about 96%, or greater than or equal to about 97% of their solid state quantum efficiency measured at a temperature of 25° C. In addition, in an embodiment, a solid state quantum efficiency at 150° C. of the quantum dots may be greater than or equal to about 80%, for example, greater than or equal to about 81%, or greater than or equal to about 82% of a solid state quantum efficiency at 25° C. Thus the quantum dots of an embodiment may be used in various optical devices operated at a relatively high temperature (e.g., an LED, various light emitting devices, quantum dot lasers, etc.) and are environmentally friendly because they do not include cadmium.

In the quantum dots according to an embodiment, the first semiconductor nanocrystal of the core may include a metal comprising a Group II metal excluding cadmium, a Group III metal, a Group IV metal, or a combination thereof.

The material of the shell, which may be crystalline or amorphous, may have the same or different composition as the first nanocrystal. The crystalline or amorphous material may include a Group II-VI compound, a Group III-V compound, a Group IV-VI compound, a Group IV compound, a metal fluoride, a metal oxide, or a combination thereof. The shell may be crystalline or amorphous. The semiconductor material of the shell may have a larger bandgap than the band gap of the core material (i.e., the first nanocrystal).

The first semiconductor nanocrystal may include a Group II-VI compound excluding a cadmium-containing compound, a Group III-V compound, a Group IV-VI compound, a Group IV compound, a Group compound, a Group I-II-IV-VI compound, or a combination thereof.

The crystalline or amorphous material of the shell may include a Group II-VI compound excluding a cadmium-containing compound, a Group III-V compound, a Group IV-VI compound, a Group IV compound, a Group I-III-VI compound, a Group I-II-IV-VI compound, a metal-containing halogen compound, a metal oxide, or a combination thereof.

The Group II-VI compound may comprise a binary element compound comprising ZnS, ZnSe, ZnTe, ZnO, HgS, HgSe, HgTe, MgSe, MgS, or a combination thereof; a ternary element compound comprising ZnSeS, ZnSeTe, ZnSTe, HgSeS, HgSeTe, HgSTe, HgZnS, HgZnSe, HgZnTe, MgZnSe, MgZnS, or a combination thereof; and a quaternary element compound comprising HgZnTeS, HgZnSeS, HgZnSeTe, HgZnSTe, or combination thereof, the Group III-V compound may comprise a binary element compound comprising GaN, GaP, GaAs, GaSb, AlN, AlP, AlAs, AlSb, InN, InP, InAs, InSb, or a combination thereof; a ternary element compound comprising GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; and a quaternary element compound comprising GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, the Group IV-VI compound may comprise a binary element compound comprising SnS, SnSe, SnTe, PbS, PbSe, PbTe, or a combination thereof; a ternary element compound comprising SnSeS, SnSeTe, SnSTe, PbSeS, PbSeTe, PbSTe, SnPbS, SnPbSe, SnPbTe, or a combination thereof; and a quaternary element compound comprising SnPbSSe, SnPbSeTe, SnPbSTe, or a combination thereof, the Group I-III-VI compound may comprise $CuInSe_2$, $CuInS_2$, CuInGaSe, and CuInGaS, the Group II-III-VI compound may comprise ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, or a combination thereof, the Group I-II-IV-VI compound may comprise CuZnSnSe, CuZnSnS, or a combination thereof, the Group IV compound may comprise a single-element that may be Si, Ge, or a combination thereof; and a binary element compound comprising SiC, SiGe, or a combination thereof, the metal-containing halogen compound may comprise LiF, NaF, KF, $BeF_2$, $MgF_2$, $CaF_2$, $SrF_2$, CuF, AgF, AuF, $ZnF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, AuCl, $ZnCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $HgI_2$, $AlI_3$, $GaI_3$, $InI_3$, $SnI_2$, $PbI_2$, or a combination thereof, and the metal oxide may comprise $In_2O_3$, PbO, HgO, MgO, $Ga_2O_3$, $Al_2O_3$, ZnO, $SiO_2$, zinc oxysulfide, zinc oxyselenide, zinc oxysulfide selenide, indium phosphide oxide, indium phosphide oxysulfide, or a combination thereof.

The core may include a Group III-V compound (e.g., InP) and the shell may include a Group II-VI compound. The core may include indium and the shell may include at least three elements (ternary element compound or quaternary element compound). The core may further include Zn. For example, the core may be a Group III-V compound including Zn (e.g., InPZn or InP(Zn)). Herein, the term InP(Zn) indicates the case where the Zn is included in a surface thereof.

In an embodiment, the quantum dot may have a quantum yield (QY) of greater than or equal to about 85%. The quantum dot may have a full width at half maximum (FWHM) of less than or equal to about 50 nm, for example, less than or equal to about 45 nm, or less than or equal to about 40 nm.

The quantum dot may absorb light in a wavelength of about 300 nm to about 700 nm and may emit light in a wavelength of about 400 nm to about 600 nm, about 600 nm to about 700 nm, or about 550 nm to about 650 nm, without limitations. The photoluminescence wavelengths may be controlled according to the compositions or the size of the quantum dot (core/shell).

The quantum dot may have a particle size (a diameter or a largest length of a straight line crossing a non-spherical particle) of about 1 nm to about 100 nm, for example about 1 nm to about 20 nm, or about 1 nm to about 10 nm or about 1 nm to about 5 nm. The shape of the quantum dot is not particularly limited. For example, the quantum dot may have a spherical, pyramidal, multi-armed (or multipod), or a cubic shape, but it is not limited thereto.

The presence of a halogen in the quantum dot may be confirmed by an X-ray photoelectron spectroscopy (XPS), without limitation. In the quantum dot, the halogen may be present as being doped. The halogen may replace an atom in the crystal structure of the quantum dot or may be present as an interstitial atom. The halogen may be present in a form of a halide of the metal included in the shell.

The quantum dot may include a coordinated organic ligand on its surface. The organic ligand may include any suitable ligand compounds and is not particularly limited. For example, the ligand compound may include a compound of the formula RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', RPO$(OH)_2$, $R_2POOH$, wherein, R and R' are each independently a substituted or unsubstituted C1 to C24 alkyl group, a substituted or unsubstituted C2 to C24 alkenyl group, a substituted or unsubstituted C2 to C24 alkynyl group, or a substituted or unsubstituted C6 to C20 aryl group, or a combination thereof. The organic ligand compound is coordinated on the surface of the produced nanocrystal, and may improve nanocrystal dispersion in a solution, which may enhance the photoluminescence and electric characteristics. Specific examples of the organic ligand compound may include thiol compounds such as methane thiol, ethane thiol, propane thiol, butane thiol, pentane thiol, hexane thiol, octane thiol, dodecane thiol, hexadecane thiol, octadecane thiol, or benzyl thiol; amines such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, or dipropyl amine; carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphines such as substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); phosphine oxides such as substituted or unsubstituted methyl phosphine oxide (e.g., trimethyl phosphine oxide, methyldiphenyl phosphineoxide, etc.), a substituted or unsubstituted ethyl phosphine oxide (e.g., triethyl phosphine oxide, ethyldiphenyl phosphineoxide, etc.), a substituted or unsubstituted propyl phosphine oxide, a substituted or unsubstituted butyl phosphine oxide, and a substituted or unsubstituted octylphosphine oxide (e.g., trioctylphosphineoxide (TOPO); diphenyl phosphine, triphenyl phosphine compound, or oxide compound thereof; phosphonic acid, and the like, but are not limited thereof. The organic ligand compound may be used at alone or as a mixture of two or more.

The quantum dot according to an embodiment may be produced in the following method, which includes:

obtaining a first mixture including a first precursor, a ligand compound, and a solvent (e.g., organic solvent);

adding a second precursor, a first halogen element source, and a first semiconductor nanocrystal to the first mixture to obtain a second mixture;

heating the second mixture up to a reaction temperature to perform a reaction between the first precursor and the second precursor; and adding a second halogen element source to the second mixture after initiating the reaction between the first precursor and the second precursor.

The first precursor may include at least two compounds. The second precursor may include at least two compounds.

When at least two compounds are used for the first and/or the second precursors, each compound may be added to the (optionally heated) first mixture (at the same or different temperature) simultaneously or with a predetermined interval. The first precursor may be mixed with the same/different ligands and/or the solvents (e.g., an organic solvent) in light of the shell composition of the final quantum dot to prepare a first mixture, which is then additionally added. The second precursor may be mixed with the same/different ligands and/or solvents (e.g., an organic solvent) in view of the shell composition of the final quantum dot and then additionally added to the first mixture at least one time (e.g., twice, three times, four times, five times, or more).

The first precursor may include a Group II metal excluding cadmium, a Group III metal, a Group IV metal, or a combination thereof. The first precursor may be a metal powder, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, or a metal peroxide.

Examples of the first precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bisacetylacetonate, tin bromide, tin chloride, tin fluoride, tin oxide, tin sulfate, germanium tetrachloride, germanium oxide, germanium ethoxide, trimethylgallium, triethylgallium, gallium acetylacetonate, gallium chloride, gallium fluoride, gallium oxide, gallium nitrate, gallium sulfate, trimethylindium, indium acetate, indium hydroxide, indium chloride, indium oxide, indium nitrate, indium sulfate, thallium acetate, thallium acetylacetonate, thallium chloride, thallium oxide, thallium ethoxide, thallium nitrate, thallium sulfate, thallium carbonate, but are not limited thereto. The first precursor may be used alone or as a mixture of at least two compounds depending on the final composition of the nanocrystal sought to prepare.

The ligand compound (i.e., the organic ligand) is the same as described above.

The solvent may be selected from a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, and squalane; a C6 to C30 aromatic hydrocarbon such as phenyl dodecane, phenyl tetradecane, and phenyl hexadecane; a phosphine substituted with a C6 to C22 alkyl group such as trioctylphosphine, a phosphine oxide substituted with a C6 to C22 alkyl group such as trioctylphosphine oxide; a C12 to C22 aromatic ether such as phenyl ether and benzyl ether; and a combination thereof. The solvent may be appropriately selected according to types of the first/second precursors, the first/second halogen source, and the organic ligand.

In the first mixture, the amounts of the first precursor, the ligand compound, and the solvent may be appropriately selected as desired (e.g., in light of a desirable thickness of the shell, types of the precursors, and the like), and they are not particularly limited. For example, a mole ratio between the first precursor and the ligand (first precursor:ligand) may be about 1:4 to about 1:0.5, for example, about 1:3.5 to about 1:1, or about 1:3 to about 1:1.5, but is not limited thereto.

The first mixture may optionally be heated. The optional step of heating the first mixture may include heating the first mixture under vacuum or under the inert gas atmosphere at a temperature of greater than or equal to about 40° C., for example, greater than or equal to about 50° C., greater than or equal to about 60° C., greater than or equal to about 70° C., greater than or equal to about 80° C., greater than or equal to about 90° C., greater than or equal to about 100° C., or greater than or equal to about 110° C. In addition, the method may include heating the first mixture under the nitrogen atmosphere at a temperature of greater than or equal to about 100° C., for example, at a temperature of greater than or equal to about 150° C., or at a temperature of greater than or equal to about 170° C.

A first semiconductor nanocrystal, a second precursor, and a first halogen source are simultaneously or sequentially (in any order) added to the (optionally heated) first mixture to provide a second mixture.

In the second mixture, the amounts of the second precursor, the first halogen source and the first semiconductor nanocrystal may be appropriately selected considering a desired composition of the quantum dot, a thickness of the shell, and the like.

Details of the first semiconductor nanocrystal are the same as described above.

The second precursor may be appropriately selected according to the types of the crystalline/amorphous materials of the shell, and is not particularly limited thereto. In an embodiment, the second precursor may include a Group V element, a compound including a Group V element, a Group IV element, or a compound including a Group IV element, or a combination thereof. Examples of the second precursor may be sulfur, selenium, or selenide, tellurium or telluride, phosphorus, arsenic or arsenide, nitrogen or a nitrogen-containing compound, hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bis(trimethylsilyl) sulfide, sulfide ammonium, sulfide sodium, selenium-trioctylphosphine (Se-TOP), selenium-tributylphosphine (Se-TBP), selenium-triphenylphosphine (Se-TPP), tellurium-tributylphosphine (Te-TBP), tellurium-triphenylphosphine (Te-TPP), tris(trimethylsilyl) phosphine, tris(dimethylamino) phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, and ammonium nitrate, but are not limited thereto. The second precursor may be used alone or in a combination of at least two compounds depending on the final composition of the nanocrystal sought to be prepared.

The first halogen source may include HF, $NH_4F$, LiF, NaF, KF, $BeF_2$, $MgF_2$, $CaF_2$, $SrF_2$, CuF, $CuF_2$, AgF, AuF, $AuF_3$, $ZnF_2$, $HgF_2$, $AlF_3$, $GaF_3$, $InF_3$, $SnF_2$, $PbF_2$, $BF_3$, $HBF_4$, a $BF_4^-$-containing salt such as alkylammonium tetrafluoroborate, a $PF_6^-$-containing salt, $B(Ar)_3$ (wherein, Ar is an aromatic C6 to C20 hydrocarbon group where at least one hydrogen is replaced by fluorine) such as $B(C_6F_5)_3$, ionic liquid, or a combination thereof.

The first halogen source may be added in an amount of about 0.001 mol % to about 500 mol %, for example, greater than or equal to about 0.01 mol %, greater than or equal to about 0.1 mol %, or about 1 mol % to about 300 mol %, or about 2 mol % to about 200 mol % to the first mixture, based on the number of moles of the first precursor.

The first halogen source may be added as a solution where the first halogen source is dissolved in an intermediate solvent, and the intermediate solvent may be water, acetone, C3 to C12 ketones such as methylethylketone, primary amines, secondary amines, tertiary amines (e.g. trioctylamine), nitrogen-containing heterocyclic compounds such as pyridine, olefin, aliphatic hydrocarbons, aromatic hydrocarbons substituted with a C1 to C20 alkyl group, phosphines substituted with alkyl group, phosphine oxides substituted with alkyl group, aromatic ethers, or a combination thereof. In the solution, a molarity of the fluorine source may be greater than or equal to about 0.001 moles per liter (mol/L).

The second mixture is heated at a reaction temperature to perform a reaction between the first precursor and the second precursor, and a shell is formed on the first semiconductor nanocrystal. The reaction temperature is not particularly limited, and may be selected appropriately based on the first precursor, the second precursor, the halogen source, and the solvent/organic ligand. For example, the reaction temperature may be greater than or equal to about 100° C., for example greater than or equal to about 120° C., greater than or equal to about 150° C., greater than or equal to about 170° C., greater than or equal to about 200° C., greater than or equal to about 210° C., greater than or equal to about 220° C., greater than or equal to about 230° C., greater than or equal to about 240° C., greater than or equal to about 250° C., or greater than or equal to about 260° C. For example, the reaction temperature may be less than or equal to about 350° C., for example less than or equal to about 340° C., less than or equal to about 330° C., less than or equal to about 320° C., or less than or equal to about 310° C. For example, the reaction temperature may be about 220° C. to about 320° C. or about 280° C. to about 320° C.

The reaction time is not particularly limited, and may be appropriately selected. For example, the reaction may be performed for greater than or equal to about 5 minutes, greater than or equal to about 10 minutes, or greater than or equal to about 15 minutes, but is not limited thereto. When the precursor mixture is added stage by stage, a reaction in each stage may be performed for a predetermined time (e.g., greater than or equal to about 5 minutes, greater than or equal to about 10 minutes, or greater than or equal to about 15 minutes). The reaction involving the halogen source may proceed rapidly, and may be performed for about 1 second or longer, for example, for about 10 seconds or longer, about 30 seconds or longer, about 1 minute or longer, about 5 minutes or longer, about 10 minutes or longer, or about 15 minutes or more, but it is not limited thereto. The reaction may be performed under an inert gas atmosphere, air, or vacuum, but is not limited thereto.

In the reaction between the first precursor and the second precursor, the crystal or amorphous material is formed and deposited on the surface of the first semiconductor nanocrystal (particle) to provide the quantum dots with a core-shell structure. When the first nanocrystal has a core-shell structure, the final nanocrystal particles may have a core-multi shell structure and include a first halogen atom on the outer layer of shell.

The crystalline or amorphous material formed by the reaction between the first precursor and the second precursor is the same as described above.

After the initiation of the reaction between the first precursor and the second precursor, in other words, after the formation of one or at least one of a plurality of monolayers (i.e., greater than or equal to one monolayer) of the crystalline or amorphous material, the second halogen source is added to the second mixture. The method may include further adding the second precursor (or a mixture of the second precursor and an organic solvent and/or a ligand) to the second reaction mixture (hereinafter, the additional addition of the second precursor), after the initiation of the reaction between the first precursor and the second precursor. The second halogen source may be added prior to or after the additional addition of the second precursor.

The second halogen source may include chlorine, bromine, iodine, or a combination thereof. The second halogen source may be a metal halide, an organic halide, or a combination thereof. The metal halide may include the same metal as the metal of the first precursor. Examples of the second halogen source may be HCl, $NH_4Cl$, HBr, $NH_4Br$, LiCl, NaCl, KCl, $BeCl_2$, $MgCl_2$, $CaCl_2$, $SrCl_2$, CuCl, AgCl, AuCl, $ZnCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $CdBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $CdI_2$, $HgI_2$, $AlI_3$, $GaI_3$, $InI_3$, $SnI_2$, $PbI_2$, a C1 to C20 aliphatic hydrocarbon chloride (e.g., $CCl_4$, $CHCl_3$, dichloroethane, tetrachloroethane, tetrachloroethylene, or hexachloroethane), a C1 to C20 aliphatic hydrocarbon bromide (e.g., dibromoethane, tetrabromoethane, or hexabromoethane), a C1 to C20 aliphatic hydrocarbon iodide (e.g., diiodoethane or tetraiodoethane) or a combination thereof, but is not limited thereto.

The amount of the second halogen source used may be selected appropriately. For example, the second halogen source may be added in an amount of about 0.001 mol % to about 500 mol %, for example, greater than or equal to about 0.01 mol %, greater than or equal to about 0.1 mol %, or about 1 mol % to about 300 mol % or about 2 mol % to about 200 mol % based on the moles of the first metal precursor.

The aforementioned method of synthesizing the quantum dot may further include adding reaction products of the first/second precursors to a nonsolvent and separating nanocrystals coordinated with the ligand compound. The nonsolvent may be a polar solvent that is miscible with the solvent used in the reaction but cannot disperse nanocrystals. The nonsolvent may be determined according to the solvent used in the reaction, and may be, for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separating may be performed using centrifugation, precipitation, chromatography, or distillation. The separated nanocrystal may be added to a rinsing solvent as needed. The rinsing solvent is not particularly limited, and may be a solvent having a similar solubility parameter to the ligand, and examples thereof may be hexane, heptane, octane, chloroform, toluene, benzene, and the like.

In another embodiment, a quantum dot polymer composite includes a polymer matrix; and the quantum dot dispersed in the polymer matrix.

The polymer matrix may include a thiolene polymer, a (meth)acrylate polymer, a urethane polymer, an epoxy polymer, a vinyl polymer, a silicone polymer, or a combination thereof. The thiolene polymer is disclosed in US-2015-0218444-A1, which is incorporated herein by reference in its entirety. The (meth)acrylate polymer, the urethane polymer, the epoxy polymer, the vinyl polymer, and the silicone polymer may be synthesized by a known method, or a monomer or polymer thereof may be commercially available.

In the polymer matrix, an amount of the quantum dot may be appropriately selected and is not particularly limited. For example, in the polymer matrix, a content of the quantum dot may be greater than or equal to about 0.1 wt %, based on the total weight of the composite, but is not limited thereto. In the polymer matrix, the content of the quantum dot may be less than or equal to about 30 wt % based on the total weight of the composite, but is not limited thereto.

The quantum dot polymer composite may be prepared by mixing the dispersion including the quantum dots with a solution including the polymer and removing the solvent. Alternatively, it may be prepared by dispersing the quantum dots in the monomer mixture for forming the polymer and polymerizing the obtained final mixture. The quantum dot-polymer composite may be a quantum dot sheet (QD sheet).

Figure 3:
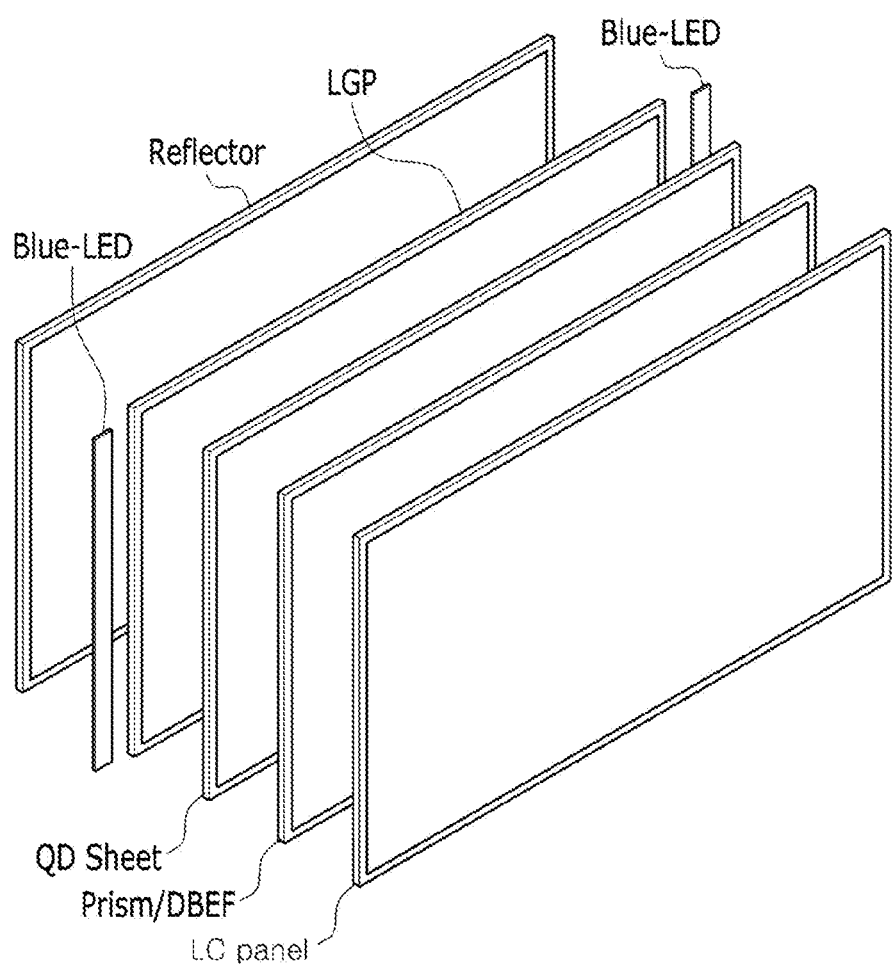
FIG. 3 is an exploded view showing an electronic device (e.g. a liquid crystal display, LCD) including the quantum dot according to a non-limiting embodiment.

Another embodiment provides an electronic device including the quantum dots. The details of the semiconductor nanocrystal particle are same as in above. The device may include a light emitting diode (LED). The device may include an organic light emitting diode (OLED). The device may be various types of display devices (e.g., liquid crystal display (LCD)), a sensor, a solar cell, or an imaging sensor, but is not limited thereto. FIG. 3 is a schematic view showing a stacking structure of a liquid crystal display (LCD) including a quantum dot sheet among the devices. The general structure of liquid crystal display (LCD) is well known, and FIG. 3 schematically shows the structure.

Referring to FIG. 3, the liquid crystal display may have a structure in which a reflector, a light guide panel (LGP) and a light source emitting a light comprising blue light (e.g, a Blue-LED), a quantum dot-polymer composite sheet (QD sheet), the various types of optical films, for example, a prism, a double brightness enhance film (DBEF) or the like are stacked, and a liquid crystal panel is disposed thereon.

Hereinafter, the exemplary embodiments are illustrated in more detail with reference to specific examples. However, they are exemplary embodiments, and the present disclosure is not limited thereto.

EXAMPLES

Analysis Method
Photoluminescence Analysis of Quantum Dots (Solution State)

It obtains a photoluminescence (PL) spectrum of quantum dots prepared at a radiation wavelength of 458 nanometers (nm) (in a case of red QD, at 532 nm) using a Hitachi F-7000 spectrometer.

Photoluminescence Analysis of Quantum Dot (Film)

It obtains a photoluminescence (PL) spectrum of a quantum dot-polymer composite prepared at a radiation wavelength of 458 nm (in the case of red QD, at 532 nm) using a PSI DARSA-5200 spectrometer.

UV Spectroscopic Analysis

UV spectroscopic analysis is performed using a Hitachi U-3310 spectrometer to provide a UV-Visible absorption spectrum.

XPS Analysis

Using a Quantum 2000 device manufactured by Physical Electronics, a XPS atomic analysis is performed under the condition of acceleration voltage: 0.5-15 keV, 300 W, minimum analysis region: 200×200 µm$^2$.

Thermal Quenching Analysis

A quantum dot polymer composite film is performed with a thermal quenching analysis within a temperature range of 25° C. to 150° C. using a spectrometer (manufacturer: PSI, model name: DARSA-5200).

Reference Example 1: Production of InP Core 0.2 mmol of indium acetate, 0.125 mmol of zinc acetate, 0.6 mmol of palmitic acid, 10 mL of 1-octadecene are placed into a reactor and heated at 120° C. under vacuum. The atmosphere in the reactor is substituted with nitrogen after one hour. After heating at 280° C., a mixed solution of 0.15 mmol of tris(trimethylsilyl)phosphine (TMS3P) and 1 mL of trioctylphosphine is rapidly added thereto and reacted for 20 minutes. The reaction solution is rapidly cooled to room temperature and added with acetone and centrifuged to provide a precipitate, and the precipitate is dispersed in toluene. An UV Spectroscopic Analysis is made and it is confirmed in a UV spectrum UV first absorption maximum wavelength is 440 nm, so the core diameter is 2.16 nm.

Example 1

1.8 mmol (0.336 gram (g)) of zinc acetate, 3.6 mmol (1.134 g) of oleic acid, and 10 mL of trioctylamine are placed into a flask and vacuumed at 120° C. for 10 minutes. Nitrogen ($N_2$) is substituted in the flask and heated at 180° C.

InP core obtained from Reference Example 1 is placed therein within 10 seconds, and subsequently slowly added with 0.04 mmol of Se/TOP and heated at 280° C. Then 0.01 mmol of S/TOP is added thereto (first addition) and heated at 320° C. and reacted for 10 minutes.

Subsequently, a mixed solution of 0.02 mmol of Se/TOP and 0.04 mmol of S/TOP is slowly added (second addition) thereto and reacted again at 320° C. for 20 minutes. Then, as a first halogen source, a mixed solution of 0.36 mmol of HF (aqueous solution 3 µL)/25 µL of acetone (intermediate solvent) is added, and right after then, a mixed solution of Se/TOP 0.01 mmol+S/TOP 0.05 mmol is slowly added (third addition) and reacted again at 320° C. for 20 minutes. Then, as a second halogen source, a mixed solution of 0.18 mmol of $ZnCl_2$/50 µL of acetone (intermediate solvent) is added and right after then, a mixed solution of Se/TOP 0.005 mmol+S/TOP 0.1 mmol is added (fourth addition) and reacted at 320° C. for 20 minutes. 0.5 mmol of S/TOP solution is added (fifth addition) and reacted at 280° C. for one hour.

After the reaction in each addition step, a small amount of sample is taken from the reaction solution and a quantitative analysis of the shell component was evaluated using inductive coupling plasma analysis to find a shell thickness. The results are shown in the following Table 1:

TABLE 1

| Samples | ICP S/In | Zn/In | Se/In | ZnSeS (nm) | Shell thickness ZnSeS (the number of monolayers) |
|---|---|---|---|---|---|
| 1 step addition | 0.462 | 5.129 | 3.602 | 0.718 | 1-2 |
| 2 step addition | 1.254 | 7.582 | 4.507 | 0.888 | 3 |
| 3 step addition | 2.760 | 10.000 | 5.620 | 1.102 | 3 |
| 4 step addition | 6.382 | 15.000 | 6.353 | 1.376 | 4 |
| 5 step addition | 13.435 | 22.087 | 6.217 | 1.707 | 5 |

It is confirmed that the shell has grown to have a thickness of about 1 to 2 (monolayers) ML after the first adding reaction.

After completing all reactions, the reactor is cooled, and the obtained nanocrystal is centrifuged in ethanol and dispersed in toluene. The obtained nanocrystal (QD) has a UV first absorption maximum wavelength of about 500-515 nm, a PL emission peak of about 520-545 nm, FWHM of about 38-44 nm.

Comparative Example 1: Halogen-Free InP/ZnSeS (Core/Shell) Quantum Dot

InP/ZnSeS (core/shell) quantum dot is synthesized in accordance with the same procedure as in Example 1, except that the first halogen source and the second halogen source are not used. The obtained nanocrystal (QD) has a PL emission peak of 531 nm and FWHM of 43 nm.

Comparative Example 2: InP/ZnSeS (core/shell) Quantum Dot with Fluorine and No Chlorine InP/ZnSeS (core/shell) quantum dot including fluorine in a shell is synthesized in accordance with the same procedure as in Example 1, except that the second halogen source is not used. The obtained nanocrystal (QD) has a PL emission peak of 536 nm and FWHM of 40 nm.

Example 2

Quantum dot is synthesized in accordance with the same procedure as in Example 1, except that trichloromethane ($CHCl_3$) is used instead of the $ZnCl_2$ solution.

The obtained quantum dot (QD) has a PL emission peak of 536 nm and a FWHM of 40 nm.

Example 3

Quantum dot is synthesized in accordance with the same procedure as in Example 1, except that 1,2-dichloroethane (DCE: $C_2H_4Cl_2$) is used instead of the $ZnCl_2$ solution.

The obtained quantum dot (QD) has a PL emission peak of 531 nm and a FWHM of 40 nm.

Example 4

Quantum dot is synthesized in accordance with the same procedure as in Example 1, except that hexachloroethane (HCE: $C_2Cl_6$) is used instead of the $ZnCl_2$ solution.

The obtained quantum dot (QD) has a PL emission peak of 532 nm and a FWHM of 40 nm.

Example 5

Quantum dot is synthesized in accordance with the same procedure as in Example 1, except that 1,1,2,2-tetrachloroethylene (TCE: $C_2Cl_4$) is used instead of the $ZnCl_2$ solution.

The obtained quantum dot (QD) has a PL emission peak of 532 nm and a FWHM of 40 nm.

Example 6

Quantum dot is synthesized in accordance with the same procedure as in Example 1, except that instead of the $ZnCl_2$ solution, a mixed solution of the solution including 0.9 mmol of $ZnCl_2$ and 250 µL of acetone (as intermediate solvent) is used. The obtained quantum dot (QD) has a PL emission peak of 531 nm and a FWHM of 42 nm.

Experimental Example 1-1: Production of Quantum Dot-Polymer Composite 30 wt % of lauryl methacrylate, 36 wt % of tricyclodecane dimethanol diacrylate, 4 wt % of trimethylol propane triacrylate, 20 wt % of epoxy diacrylate oligomer (manufacturer: Sartomer), 1 wt % of 1-hydroxy-cyclohexyl-phenyl-ketone, and 1 wt % of 2,4,6-trimethylbenzoyl-diphenyl-phosphine oxide are mixed to provide a mixture of monomer and oligomer. The mixture is defoamed under vacuum.

In Example 1 to 6, Comparative Example 1 and Comparative Example 2, each of the synthesized quantum dots is centrifuged. The toluene dispersion of the obtained quantum dots [concentration: (absorption at 449 nm)×(volume of QD solution (mL))=3.75] is mixed with the excess amount of ethanol again and centrifuged. The separated quantum dots are dispersed in 0.15 g (10 wt % of the entire composition except the initiator) of laurylmethacrylate and then added into the prepared monomer (oligomer) mixture (1.35 g) and stirred (vortexing) to provide a semiconductor nanocrystal composition.

About 1 g of semiconductor nanocrystal composition thus obtained is drop-casted on a PET film sputtered with SiOx as a barrier film on one surface (manufactured from I-component, hereinafter referred to barrier film). Another barrier film is covered on the composition and cured by UV light for 10 seconds (light intensity: 100 mW/cm$^2$) to provide a quantum dot-polymer composite sheet.

Experimental Example 1-2: Photoluminescence Characteristics

Each of quantum dot polymer composite sheets obtained from Experimental Example 1-1 is measured for a photoconversion efficiency (CE) according to the following method:

The quantum dot-polymer composite sheet is inserted between the light guide panel and the optical sheet of a 60 inch TV mounted with a blue LED having a peak wavelength of 449 nm.

From the spectrum obtained by a spectroradiometer (Konica Minolta, CS-2000) located about 45 cm in front of the operating TV, a photoconversion efficiency is calculated by the following formula:

Photoconversion Efficiency=(green or red light emission peak area)/(light emission area of blue LED chip before emitting green or red light–blue light emission area when emitting the green or red light)×100.

A ratio (%) of the relative photoconversion efficiency of Comparative Example 2 and each Example with respect to the photoconversion efficiency (100%) of a sheet including quantum dots according to Comparative Example 1 is shown in the following Table 2:

TABLE 2

|  | Halogen(s) in shell | Relative photoconversion efficiency of film |
|---|---|---|
| Comparative Example 1 | — | 100% |
| Comparative Example 2 | F | 102.9% |
| Example 1 | F, Cl | 106.1% |
| Example 2 | F, Cl | 106% |
| Example 3 | F, Cl | 106% |
| Example 4 | F, Cl | 104.2% |
| Example 5 | F, Cl | 104% |

From the results of Table 2, it is confirmed that the photoconversion efficiencies of films including QD according to Comparative Example 2 and Examples 1 to 5 are greater than the photoconversion efficiency of film including quantum dots according to Comparative Example 1.

Experimental Example 1-3: Evaluation of Thermal Quenching Phenomenon

For each quantum dot polymer composite sheet obtained from Experimental Example 1-1, a thermal quenching phenomenon is evaluated as follows:

The quantum dot polymer composite film is inserted into a PSI DARSA-5200 spectrometer. The temperature of the holder is controlled at 25° C. and irradiated with blue light and measured for a photoluminescence intensity (that is directly related to the solid state photoluminescent quantum efficiency (QE) of the quantum dots dispersed in the sheet), and then the temperature is increased to 50° C. When the temperature reaches 50° C., the film is irradiated with blue light again and measured for a photoluminescence intensity. The same measurement is then performed at 75° C., 100° C., 125° C., and 150° C. The amount of thermal quenching is determined as follows:

The relative photoluminescence intensity (%) at each temperature to the photoluminescence intensity (100%) at 25° C. is obtained.

Figure 2:
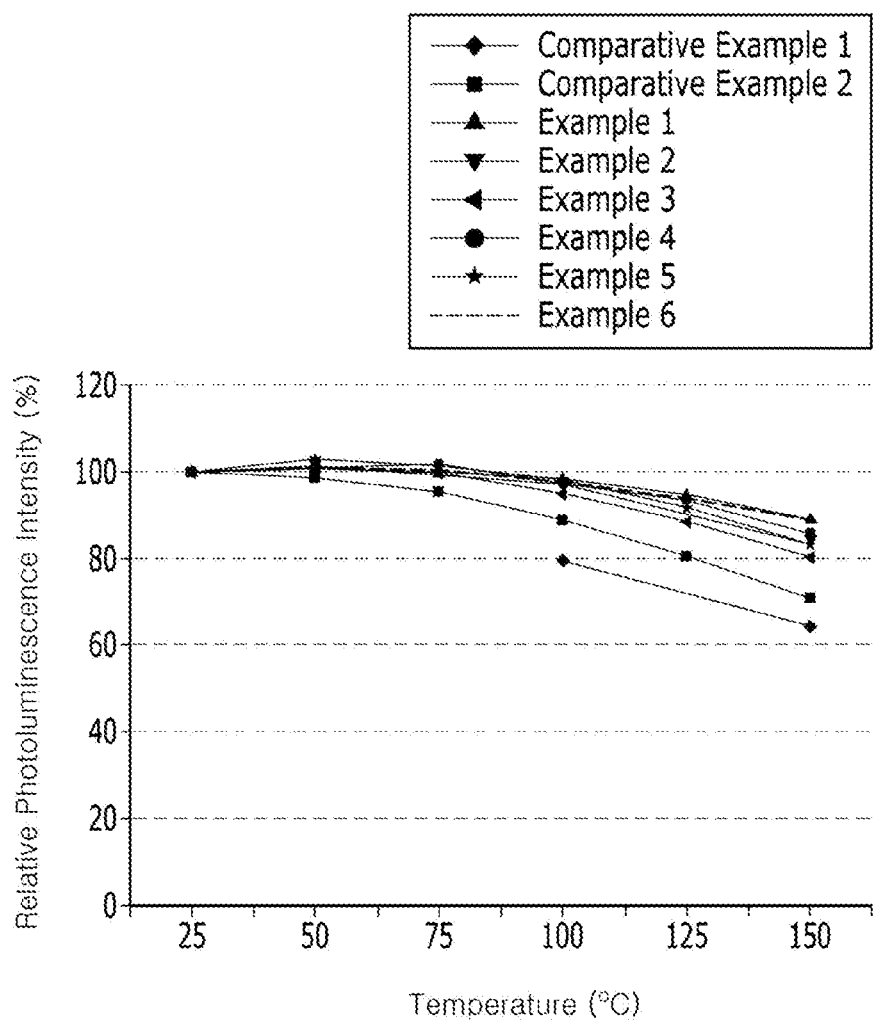
FIG. 2 is a graph of quantum efficiency (QE, %) versus temperature (° C.) showing the results of Experimental Example 2-1, showing the thermal quenching related properties of quantum dot-polymer composite sheets prepared in Experimental Example 1-1.

The results are shown in Table 3 and FIG. 2.

TABLE 3

| | QE percentage (%) at each temperature when QE at 25° C. is 100% | | | | | | | |
|---|---|---|---|---|---|---|---|---|
| Temperature (° C.) | Comp. Ex. 1 | Comp. Ex. 2 | Ex. 1 $ZnCl_2$ | Ex. 2 $CHCl_3$ | Ex. 3 DCE | Ex. 4 HCE | Ex. 5 TCE | Ex. 6 $ZnCl_2$ |
| 25 | 100 | 100.0 | 100 | 100 | 100.0 | 100.0 | 100.0 | 100.0 |
| 50 | | 98.6 | 101.1 | 101.3 | 100.7 | 100.8 | 103.1 | 100.8 |
| 75 | | 95.4 | 100.1 | | 99.7 | 101.6 | 101.2 | 100.4 |
| 100 | 79.5 | 88.8 | 98.7 | 97.2 | 95.2 | 97.3 | 98.2 | 97.6 |
| 125 | | 80.5 | 95.0 | | 88.4 | 93.3 | 91.8 | 94.0 |
| 150 | 64.6 | 70.7 | 89.4 | 84.2 | 80.4 | 86.0 | 83.2 | 89.0 |

From the results of Table 3 and FIG. 2, it is confirmed that the sheets including quantum dots according to Example 1 may have a quantum efficiency at greater than or equal to 95° C. of greater than or equal to about 90% (for example, the quantum efficiency at 100° C. of 98.7%, and the quantum efficiency at 150° C. of 89.4%) with respect to the quantum efficiency at 25° C. The sheets including quantum dots according to Comparative Examples have a photoconversion efficiency at 100° C. and a photoconversion efficiency at 150° C. that are less than those of the sheets including quantum dots according to Examples.

Experimental Example 1-4: XPS Analysis

Quantum dots obtained from Example 1 and Quantum dots obtained from Comparative Example 2 are evaluated by an XPS analysis, and the results are shown in the following Table 4:

TABLE 4

| | Atomic ratio of each element (S, Cl, Zn, or Se) with respect to indium | | | |
|---|---|---|---|---|
| | S (2p) | Cl (2p) | Zn (2p3) | Se (3d) |
| Comparative Example 2 | 6.79 | — | 13.60 | 6.45 |
| Example 1 | 8.92 | 0.71 | 16.37 | 6.74 |

From the results of Table 4, it is confirmed that Cl is present in the quantum dots according to Example 1.

Example 7

Quantum dots are synthesized in accordance with the same procedure as in Example 1, except that a LiCl organic solution is used instead of the $ZnCl_2$ solution.

The obtained QD has a PL emission peak of 538 nm and a FWHM of 39 nm.

Example 8

Quantum dots are synthesized in accordance with the same procedure as in Example 1, except that a LiBr organic solution is used instead of the $ZnCl_2$.

The obtained QD has a PL emission peak of 537 nm and a FWHM of 40 nm.

Comparative Example 3

Quantum dots are synthesized in accordance with the same procedure as in Example 1, except HF (i.e., first halogen source) is not used, and a $ZnCl_2$ organic solution is used.

The obtained QD has a PL emission peak of 529 nm and a FWHM of 42 nm.

Comparative Example 4

Quantum dots are synthesized in accordance with the same procedure as in Example 1, except HF (i.e., first halogen source) is not used, and a $ZnBr_2$ organic solution is used instead of the $ZnCl_2$ solution.

The obtained QD has a PL emission peak of 531 nm and a FWHM of 42 nm.

Comparative Example 5

Quantum dots are synthesized in accordance with the same procedure as in Example 1, except HF (i.e., first halogen source) is not used, and both the ZnCl₂ solution and the ZnBr₂ solution are used.

The obtained QD has a PL emission peak of 529 nm and a FWHM of 44 nm.

Experimental Example 2-1

A quantum dot-polymer composite sheet is prepared in accordance with the same procedure as in Experimental Example 1-1, except that each quantum dot synthesized from Example 7, Example 8, Comparative Example 3, Comparative Example 4, and Comparative Example 5 is used.

Experimental Example 2-2

Each of the quantum dot polymer composite sheets obtained from Experimental Example 2-1 is measured for a photoconversion efficiency (CE) in accordance with the same procedure as in Experimental Example 1-2. The results are shown in Table 5.

TABLE 5

|  | Halogen in shell | Relative photoconversion efficiency of film |
|---|---|---|
| Comparative Example 1 | — | 100% |
| Example 7 | F, Cl | 105.2% |
| Example 8 | F, Br | 105.4% |
| Comparative Example 3 | Cl | 100.7% |
| Comparative Example 4 | Br | 100.7% |
| Comparative Example 5 | Cl, Br | 99.2% |

From Table 5, it is confirmed that the quantum dot-polymer composite including quantum dots including fluorine and chlorine, fluorine and bromine in the shell have improved photoconversion efficiency compared to the quantum dots according to Comparative Examples.

Example 9

Quantum dots (Examples 9-1, 9-2, 9-3, 9-4 and 9-5) are synthesized in accordance with the same procedure as in Example 1, except that the adding time of ZnCl₂ solution is changed as in the following Table 6. PL emission peak, and FWHM of the obtained quantum dots are shown in the following Table 6.

A quantum dot-polymer composite sheet is prepared in accordance with the same procedure as in Experimental Example 1-1, except that quantum dots of Examples 9-1, 9-2, 9-3, 9-4 and 9-5 are used, respectively. Each of the obtained quantum dot polymer composite sheets is measured for a relative photoconversion efficiency in accordance with the same procedure as in Experimental Example 1-2. The results are shown in Table 6.

Comparative Example 6

Quantum dots are synthesized in accordance with the same procedure as in Example 1, except that the ZnCl₂ solution is simultaneously added on the first addition (i.e., simultaneously added with the first semiconductor nanocrystal).

The quantum dot-polymer composite sheet is prepared in accordance with the same procedure as in Experimental Example 1-1, except that the obtained quantum dots are used. Each of the obtained quantum dot polymer composite sheets is measured for a relative photoconversion efficiency in accordance with the same procedure as in Experimental Example 1-2. The results are shown in Table 6.

TABLE 6

|  | Addition time | Photoluminescence properties of quantum dot | | Relative photoconversion efficiency of film (CE) |
|---|---|---|---|---|
|  |  | @458 (nm) | FWHM (nm) |  |
|  | ZnCl₂ (mole ratio with respect to amount of first precursor = 1/10) |  |  | 100% |
| Example 9-1 | 3 step addition (reaction temperature = 320° C.) | 528 | 42 | 105.6% |
| Example 9-2 | 4 step addition (reaction temperature = 200° C.) | 531 | 41 | 104.8% |
| Example 9-2 | 4 step addition (reaction temperature = 320° C.) | 536 | 39 | 105.6% |
| Example 9-2 | Addition in 10 min. after 4 step addition | 530 | 41 | 105.0% |
| Example 9-2 | Addition in 20 min. after 4 step addition | 531 | 40 | 105.2% |
| Comparative Example 6 | 1 step addition (i.e., addition of first semiconductor nanocrystal) with second halogen source (Cl) | 533 nm | 42 nm | 80% |

From the results shown in Table 6, it is confirmed that it may improve the photoluminescence properties of quantum dots and the photoconversion efficiency of the film including the same when adding the second halogen source after initiating the reaction of the first precursor and the second precursor. When the halogen source is added together with a core (i.e., first semiconductor nanocrystal), the halogen may have reacted before forming the shell to a predetermined thickness (e.g., greater than or equal to 1 ML), and it may be confirmed that enhancing effects are not observed.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A core-shell quantum dot including at least two different halogens, the core-shell quantum dot comprising:
a core comprising a first semiconductor nanocrystal; and
a shell disposed on the core, the shell comprising a crystalline or amorphous material,
wherein the core-shell quantum dot does not include cadmium,
wherein the at least two different halogens comprise fluorine and chlorine, and
wherein the core-shell quantum dot has a quantum yield of greater than or equal to about 85%.

2. The core-shell quantum dot of claim 1, wherein the core-shell quantum dot has a FWHM of less than or equal to about 50 nm.

3. The core-shell quantum dot of claim 1, wherein at least one of the first semiconductor nanocrystal and the crystalline or amorphous material of the shell comprises Indium and phosphorous.

4. The core-shell quantum dot of claim 1, wherein at least one of the first semiconductor nanocrystal and the crystalline or amorphous material of the shell comprises zinc and at least one of sulfur and selenium.

5. The core-shell quantum dot of claim 1, wherein a solid state photoluminescence quantum efficiency of the core-shell quantum dot when measured at 90° C. is greater than or equal to about 95% of the solid state photoluminescence quantum efficiency of the core-shell quantum dot when measured at 25° C.

6. The core-shell quantum dot of claim 1, wherein a solid state photoluminescence quantum efficiency of the core-shell quantum dot when measured at 150° C. is greater than or equal to about 80% of the solid state photoluminescence quantum efficiency of the core-shell quantum dot when measured at 25° C.

7. The core-shell quantum dot of claim 1, wherein the quantum dot has a particle size of greater than or equal to about 5 nm.

8. The core-shell quantum dot of claim 1, wherein each halogen is present in or on the shell in a doped form or in a form of a metal halide.

9. The core-shell quantum dot of claim 1, wherein the shell has a thickness of at least one monolayer of the material of the shell, and at least one of the halogens is present at or outside the thickness of the one monolayer.

10. The core-shell quantum dot of claim 1, wherein a total amount of the fluorine and the chlorine is greater than or equal to about 30 atomic percent, with respect to a total amount of a metal atom included in the core.

11. The core-shell quantum dot of claim 1, wherein the first semiconductor nanocrystal comprises at least one first metal selected from a group consisting of a Group II metal excluding cadmium, a Group III metal, a Group IV metal, and a combination thereof, and
wherein the crystalline or amorphous material of the shell comprises at least one second metal that is different form the first metal and is selected from the group consisting of a Group I metal, a Group II metal excluding cadmium, a Group III metal, a Group IV metal, and a combination thereof.

12. The core-shell quantum dot of claim 1, wherein the first semiconductor nanocrystal comprises a Group II-VI compound excluding a cadmium-containing compound, a Group III-V compound, a Group IV-VI compound, a Group IV element or compound, a Group II-III-VI compound, a Group I-III-VI compound, a Group I-II-IV-VI compound, or a combination thereof, and
wherein the crystalline or amorphous material of the shell comprises a Group II-VI compound excluding a cadmium-containing compound, a Group III-V compound, a Group IV-VI compound, a Group IV element or compound, a Group II-III-VI compound, a Group I-III-VI compound, a Group I-II-IV-VI compound, a metal-containing halogen compound, a metal oxide, or a combination thereof.

13. The core-shell quantum dot of claim 12, wherein, the Group II-VI compound comprises ZnS, ZnSe, ZnTe, ZnO, HgS, HgSe, HgTe, MgSe, MgS, ZnSeS, ZnTeSe, ZnSTe, HgSeS, HgSeTe, HgSTe, HgZnS, HgZnSe, HgZnTe, MgZnSe, MgZnS, HgZnTeS, HgZnSeS, HgZnSeTe, or a combination thereof,
the Group III-V compound comprises GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof,
the Group IV-VI compound comprises SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, or a combination thereof,
the Group I-III-VI compound comprises $CuInSe_2$, $CuInS_2$, CuInGaSe, CuInGaS, or a combination thereof,
the Group II-III-VI compound comprises ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, or a combination thereof,
the Group I-II-IV-VI compound comprises CuZnSnSe, CuZnSnS, or a combination thereof,
the Group IV element compound comprises Si, Ge, SiC, SiGe, or a combination thereof,
the metal-containing halogen compound comprises LiF, NaF, KF, $BeF_2$, $MgF_2$, $CaF_2$, $SrF_2$, CuF, AgF, AuF, $ZnF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, AuCl, $ZnCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $HgI_2$, $AlI_3$, $GaI_3$, $InI_3$, $SnI_2$, $PbI_2$, or a combination thereof, and the metal oxide comprises $In_2O_3$, PbO, HgO, MgO, $Ga_2O_3$, $Al_2O_3$, ZnO, $SiO_2$, zinc oxysulfide, zinc oxyselenide, zinc oxysulfide selenide, indiumphosphide oxide, indiumphosphide oxysulfide, or a combination thereof.

14. The core-shell quantum dot of claim 1, wherein the first semiconductor nanocrystal comprises a Group III-V compound or a Group II-VI compound, and the shell comprises a Group II-VI compound.

15. The core-shell quantum dot of claim 1, wherein a total amount of the fluorine and the chlorine is greater than or equal to about 40 atomic percent, with respect to a total amount of a metal atom included in the core.

16. A quantum dot polymer composite comprising
a polymer matrix; and
the core-shell quantum dot of claim 1 dispersed in the polymer matrix.

17. The quantum dot polymer composite of claim 16, wherein the polymer matrix comprises a thiolene polymer, a (meth)acrylate polymer, a urethane polymer, an epoxy polymer, a vinyl polymer, a silicone polymer, or a combination thereof.

18. The quantum dot polymer composite of claim 16, wherein a content of the quantum dot is greater than or equal to about 0.1 wt % and less than or equal to about 30 wt % based on the total weight of the quantum dot polymer composite.

19. An electronic device comprising the core-shell quantum dot of claim 1.

20. The electronic device of claim 19, wherein the electronic device comprises a light source emitting a light comprising blue light and a quantum dot polymer composite, wherein the quantum dot polymer composite comprises a polymer matrix and a plurality of the core-shell quantum dots.

21. The electronic device of claim 19, wherein the light source comprises an organic light emitting diode.

* * * * *